United States Patent
Kawajiri et al.

(10) Patent No.: US 8,129,016 B2
(45) Date of Patent: Mar. 6, 2012

(54) SUBSTRATE SUPPORTING MEMBER

(75) Inventors: Tetsuya Kawajiri, Handa (JP);
Yasufumi Aihara, Nagoya (JP);
Tomoyuki Fujii, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 971 days.

(21) Appl. No.: 11/867,044

(22) Filed: Oct. 4, 2007

(65) Prior Publication Data

US 2008/0138645 A1    Jun. 12, 2008

Related U.S. Application Data

(60) Provisional application No. 60/828,409, filed on Oct. 6, 2006.

(51) Int. Cl.
*B32B 3/26*  (2006.01)
*B32B 15/00*  (2006.01)

(52) U.S. Cl. .............. 428/312.2; 428/307.7; 428/317.1; 428/317.7; 428/336; 428/457; 428/469; 428/214; 428/689; 428/698; 428/699

(58) Field of Classification Search .............. None
See application file for complete search history.

(56) References Cited

U.S. PATENT DOCUMENTS

| 6,108,190 | A  | 8/2000 | Nagasaki |
| 6,134,096 | A  | 10/2000 | Yamada et al. |
| 6,538,872 | B1 | 3/2003 | Wang et al. |
| 2002/0036881 | A1 | 3/2002 | Shamouilian et al. |
| 2002/0075624 | A1 | 6/2002 | Wang et al. |
| 2005/0118450 | A1 | 6/2005 | Fujii et al. |
| 2006/0112880 | A1 | 6/2006 | Iwabuchi et al. |

FOREIGN PATENT DOCUMENTS

| EP | 1 193 751 A1 | 4/2002 |
| JP | 11-163109 A1 | 6/1999 |
| JP | 2001-102436 A | 4/2001 |
| JP | 2005-101108 A1 | 4/2005 |
| KR | 2006-0061256 A1 | 6/2006 |

*Primary Examiner* — Ling Xu
(74) *Attorney, Agent, or Firm* — Burr & Brown

(57) ABSTRACT

A substrate supporting member includes: a plate-shaped ceramic body having a surface serving as a substrate supporting surface; a plate-shaped composite material body which is joined to a surface of the ceramic body opposite to the substrate supporting surface with a joint material interposed therebetween and the plate-shaped composite material body made of porous ceramic with pores filled with metal, the composite material body having a porosity of more than 0% and not more than 5%; and a metallic plate which is joined to a surface of the composite material body opposite to the surface joined to the ceramic body with a joint material interposed therebetween.

1 Claim, 3 Drawing Sheets

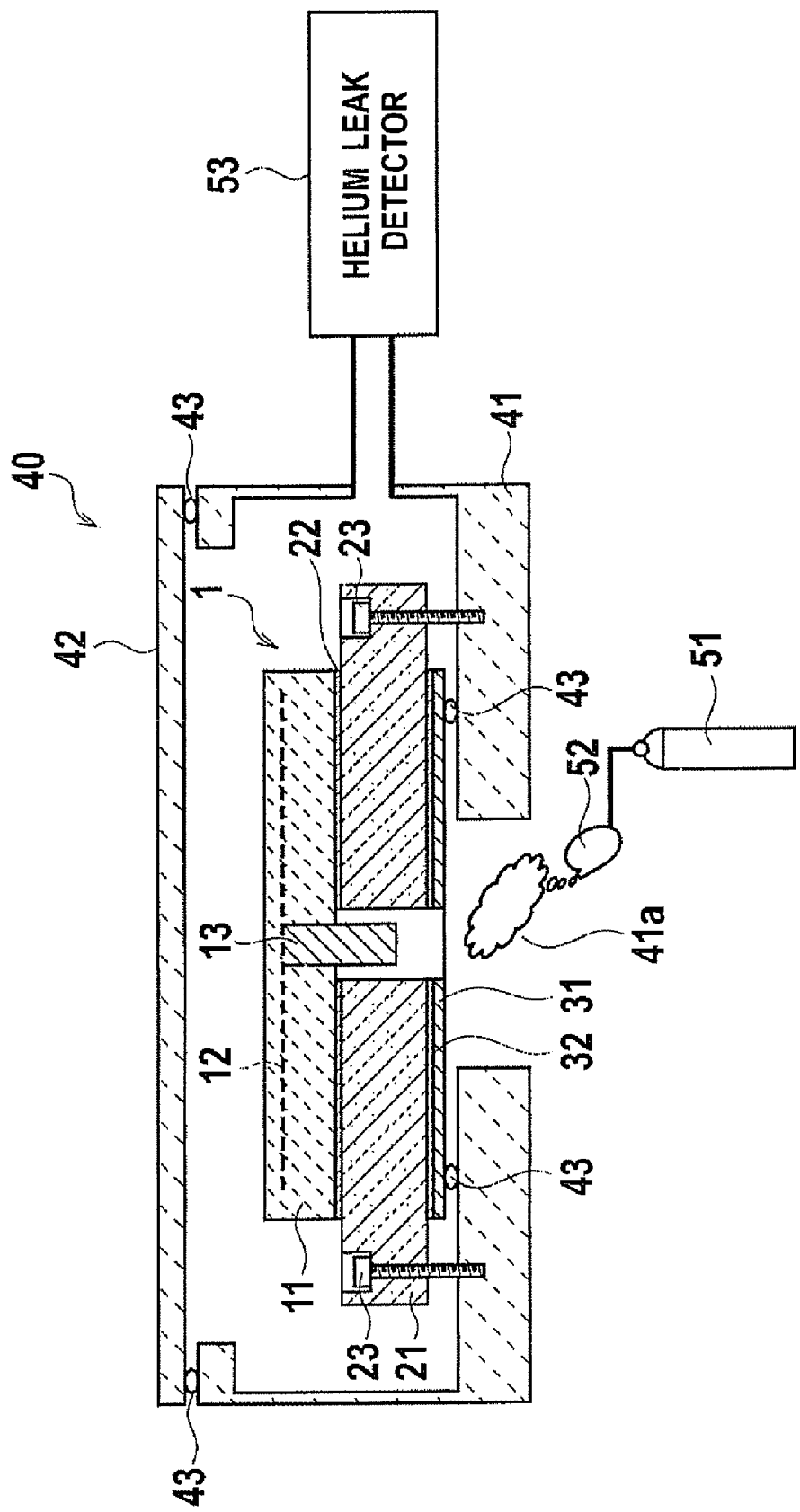

SUBSTRATE SUPPORTING MEMBER

CROSS REFERENCE TO RELATED APPLICATIONS

This application is based upon and claims the benefit of priority from Provisional Patent Application No. 60/828,409 filed on Oct. 6, 2006 in the United States Patent and Trademark Office, of which contents are incorporated herein by reference.

BACKGROUND OF THE INVENTION

1. Field of the Invention

The present invention relates to a substrate supporting member on which a substrate of a semiconductor wafer or the like is placed.

2. Description of Related Art

In a manufacturing process of semiconductor devices, various types of substrate supporting members on which substrates such as semiconductor wafers are placed have been used, for example, a ceramic heater, an electrostatic chuck, a hot electrostatic chuck, and the like.

The ceramic heater, electrostatic chuck, or the like includes a linear, plate-shaped or film shaped electrode embedded in a ceramic body having a disk shape in accordance with the shape of semiconductor wafers. The electrode of the ceramic heater is used as a heating element which raises substrate temperature to a predetermined temperature. The electrode of the electrostatic chuck is used to produce Coulomb force or Johnsen-Rabek force which attracts and fixes a semiconductor wafer onto the substrate supporting member.

Recently, as for an etching process in the manufacturing process of semiconductor devices, for the purpose of improving an etching selectivity and an aspect ratio of etching shape and the like, a so-called low-temperature etching process is proposed, which performs etching while cooling semiconductor wafers. In addition to such an etching process, processes requiring cooling of a semiconductor wafer placed on the substrate supporting member are increasing in various types of thin film processing or characteristic evaluation of substrates. Moreover, when the substrate supporting member is used in a process at high temperature, it is desired that the substrate supporting member is equipped with a cooling function in order to reduce the substrate temperature to the room temperature for a shorter time and control an in-plane temperature distribution of the semiconductor wafer in the high-temperature process.

To address such a need, a substrate supporting member is proposed in which a base body composed of a composite material of porous ceramic and filler metal is brazed using a brazing material to a ceramic body constituting a substrate supporting section of the substrate supporting member and is used as a heat sink (Japanese Patent Laid-open Publication No. 11-163109). The composite material has a thermal expansion coefficient lower than that of a metallic member and has good workability.

Moreover, a method of manufacturing a substrate supporting member is proposed in which the base body and ceramic body are pressure-welded (Japanese Patent Laid-open Publication 2005-101108).

In the manufacturing process of semiconductor devices, the substrate supporting member is provided in a processing chamber in which the atmosphere (gas concentration, gas pressure, gas temperature, and the like) can be controlled in a semiconductor device manufacturing apparatus. A substrate placed on this substrate supporting member is subjected to processing such as etching or film formation in a predetermined atmosphere of the processing chamber.

The base body of this substrate supporting member is made of the composite material of porous ceramic and filler metal as described above, in which all the pores of the porous ceramic are not filled with metal and a few pores remain unfilled. When the processing chamber is highly vacuumed for processing such as etching or film formation, accordingly, gas flows into the processing chamber from the outside through the pores remaining in the base body even if the processing chamber is sealed to be airtight in the periphery of the base body. This sometimes prevents the processing chamber from ensuring sufficient. sealing performance.

Moreover, the sealing in the periphery of the base body in the processing chamber is performed by sealing means such as an O-ring. The pores remaining in the base body are exposed in the surface. Accordingly, some pores communicate between the inside and outside in the sealing surface of the O-ring or the like even if the pores do not communicate with each other within the base body. Furthermore, the difference in thermal expansion coefficient between the ceramic body and base body of the substrate supporting member sometimes causes warp of the base body of the substrate supporting member. The warp of the base body might cause degradation in adhesion of the seal portion and might inversely affect the sealing by the sealing means in the periphery of the base body.

When air flows into the processing chamber from the outside during the processing of the substrate, processing conditions of the substrate fluctuate, making it difficult to perform good film formation and etching.

The present invention is advantageous in solving the aforementioned problems, and an object of the present invention is to provide a substrate supporting member which is capable of maintaining high vacuum in the processing chamber.

SUMMARY OF THE INVENTION

A substrate supporting member of the present invention includes: a plate-shaped ceramic body having a surface serving as a substrate supporting surface; a plate-shaped composite material body which is joined to a surface of the ceramic body opposite to the substrate supporting surface with a joint material interposed therebetween and made of porous ceramic with pores filled with metal, the composite material body having a porosity of more than 0% and not more than 5%; and a metallic plate which is joined to a surface of the composite material body opposite to the surface joined to the ceramic body with a joint material interposed therebetween.

According to the substrate supporting member of the present invention, it is possible to control gas from leaking through the substrate supporting member and as such, perform good processing for a substrate by keeping the processing chamber at high vacuum.

BRIEF DESCRIPTION OF THE DRAWINGS

FIG. 3 is an explanatory view of a method to evaluate leakage.

DETAILED DESCRIPTION OF THE INVENTION

Hereinafter, a specific description is given of a substrate supporting member according to an embodiment of the present invention using drawings.

Figure 1:
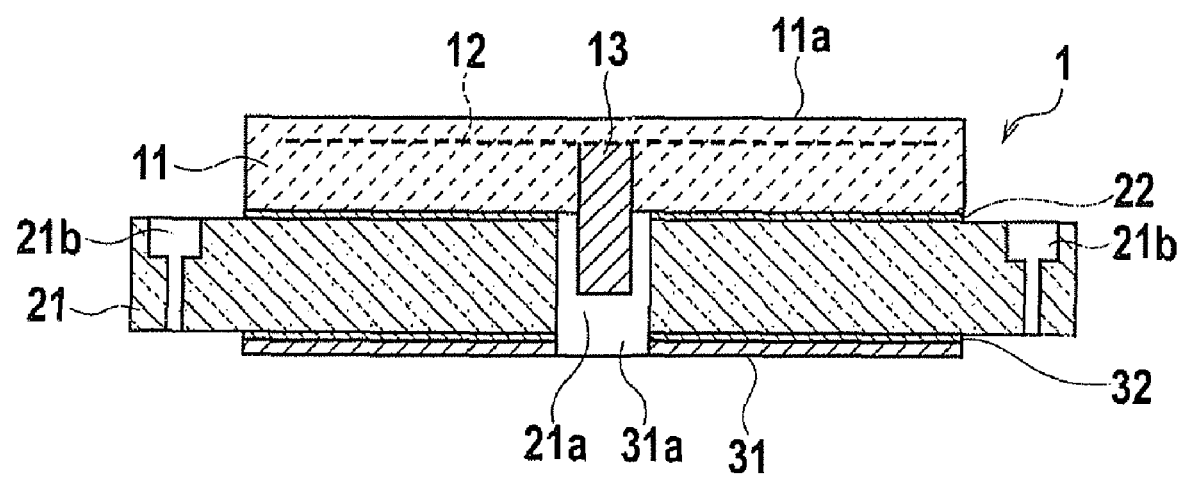
FIG. 1 is a cross-sectional view showing a substrate supporting member according to an embodiment of the present invention.

FIG. 1 is a cross-sectional view showing the substrate supporting member according to the embodiment of the present invention. The substrate supporting member 1 shown in FIG. 1 functions as an electrostatic chuck for example. The substrate supporting member 1 includes a ceramic body 11. The ceramic body 11 has a substantially disk shape, and a plane thereof serves as a substrate supporting surface 11a on which a substrate attracted and fixed by the substrate supporting member 1 is placed. In the vicinity of the substrate supporting surface 11a within the substrate supporting member 1, an electrode 12 to generate electrostatic attraction force is embedded. The electrode 12 is connected to a terminal 13 to introduce electric power from a not shown power supply to the electrode 12.

Preferably, the ceramic body 11 is, for example, composed of at least a ceramic selected from aluminum nitride, silicon carbide, alumina, silicon nitride, and sialon or a ceramic containing one of these ceramics as a main component and a proper sub-component.

On the other side of the ceramic body 11 from the substrate supporting surface 11a, a composite material body 21 is provided for purposes of facilitating attaching the ceramic body 11 to the inside of a not-shown processing chamber, cooling the back of the ceramic body 11 to control temperature or an in-plane temperature distribution of a substrate placed on the substrate supporting surface 11a, and the like. The composite material body 21 is made of a composite material of porous ceramic and a metallic material filled in pores of the porous ceramic and is joined to the ceramic body 11 with a joint material 22 interposed therebetween. In the composite material body 21, a through hole 21a allowing a terminal 13 to be inserted therethrough and bolt holes 21b used to fasten the composite material body 21 to the not-shown processing chamber are formed at the center and the periphery thereof, respectively.

The material applied to the composite material body 21 is a composite material of porous ceramic with pores filled with metal as a material having a good thermal conductivity and a thermal expansion coefficient close to that of the ceramic body 11. The composite material body 21 has a porosity of less than 5% as a whole. The porosity is desirably as small as possible, but it is difficult to reduce the porosity to zero since the composite material is manufactured by pressing molten metal into the pores of the porous ceramic. The composite material with a porosity of less than 5% is therefore applied. With a composite material having a porosity of not less than 5%, a large amount of gas may flow through the pores.

The materials of porous ceramic and filler metal of the composite material body 21 are combined from the aforementioned perspectives of having good thermal conductivity and having a thermal expansion coefficient close to that of the ceramic body 11. For example, the porous ceramic can be alumina, aluminum nitride, silicon carbide, silicon nitride, sialon, or the like which is the same as or different from the material of the ceramic body 11. Preferably, the filler metal can be, for example, Al or an alloy of Al and Si, which has high resistance to corrosion and can be easily pressed into pores. When the ceramic body 11 is mainly composed of aluminum nitride or alumina, it is preferable to use a composite material of silicon carbide and aluminum for the composite material body 21. This is because the thermal expansion coefficients of the ceramic body and a cooling member can be configured to suitably match each other. Since the composite material body 21 has a thermal expansion coefficient close to that of the ceramic body 11, the composite material body 21 is resistant to warp or peel-off at the joint portion after being joined to the ceramic body 11. Moreover, the composite material body 21 has good workability and a little processing burden. Furthermore, since the pores of the composite material are filled with metal, the composite material has higher thermal conductivity than that of simple ceramic and can efficiently cool the ceramic body.

The composite material body 21 and ceramic body 11 are joined to each other with the joint material 22. The joint material 22 may be a brazing material mainly composed of aluminum. However, it is preferable that the joint material 22 has a thickness of about 50 to 200 μm and contains an aluminum alloy. Moreover, the joint material 22 is a material allowing pressure welding of the ceramic body 11 and composite material body 21. By performing pressure welding, generation of pores, which can be caused in the case of joining by melt solidification, is eliminated, and good adhesive strength can be obtained. Moreover, by such pressure welding, it is possible to obtain a thickness of the aluminum alloy layer which cannot be obtained by brazing.

By setting the thickness of the joint material 22 or the thickness of the aluminum alloy layer to 50 μm or more and 200 μm or less, residual stress remaining in the joint part of the ceramic substrate 11 can be effectively reduced, and moreover, variations in characteristics of the composite material body 21 can be reduced. It is therefore possible to reduce warp of the substrate supporting surface 11a caused by the residual stress and improve the adhesion between the substrate and substrate supporting surface 11, thus increasing the thermal uniformity of the substrate. In order to effectively further reduce the residual stress, the thickness of the aluminum alloy layer is preferably in a range of not less than 100 μm and not more than 150 μm.

Since this joint material 22 has high thermal conductivity in the in-plane direction when joint material 22 has a thickness of 50 μm or more, even if the thermal conductivity of the composite material body 21 varies in the in-plane direction, the influence by the variations of the composite material body 21 can be suppressed. Moreover, in the case where the joint material 22 has a thickness of 50 μm or more, plastic deformability of the aluminum alloy of the joint material 22 can reduce variations in strength of the joint material 22.

To improve the wet-ability of the joint material 22 to the ceramic substrate 11, it is preferable that the joint material 22 further contains at least a metal selected from magnesium, titanium, zirconium, and hafnium in addition to the aluminum alloy. When the content of such additional metal is too high, the resistance to corrosion of the joint material 22 is reduced. Accordingly, the content of the additional metal is preferably not less than 0.3 wt % and not more than 5.0 wt %. It is possible to further add silicon or boron to the aluminum alloy, which can reduce liquidus temperature. To prevent degradation of the resistance to corrosion, the additive amount of silicon or boron is preferably not more than 20 wt % and more preferably 1 to 1.2 wt %.

In the substrate supporting member 1 of the embodiment, a metallic plate 31 is provided on the surface of the composite material body 21 opposite to the surface joined to the ceramic body 11. The metallic plate 31 is joined to the composite material body 21 with a joint material 32 interposed therebetween. In the metallic plate 31, a hole 31a continuous to the through hole 21a of the composite material body 21 is formed, through which the terminal 13 can be inserted. The other surface of the metallic plate 31 comes into contact with a sealing member of the processing chamber to keep the processing chamber airtight in the vicinity of the substrate supporting member 1.

Figure 2:
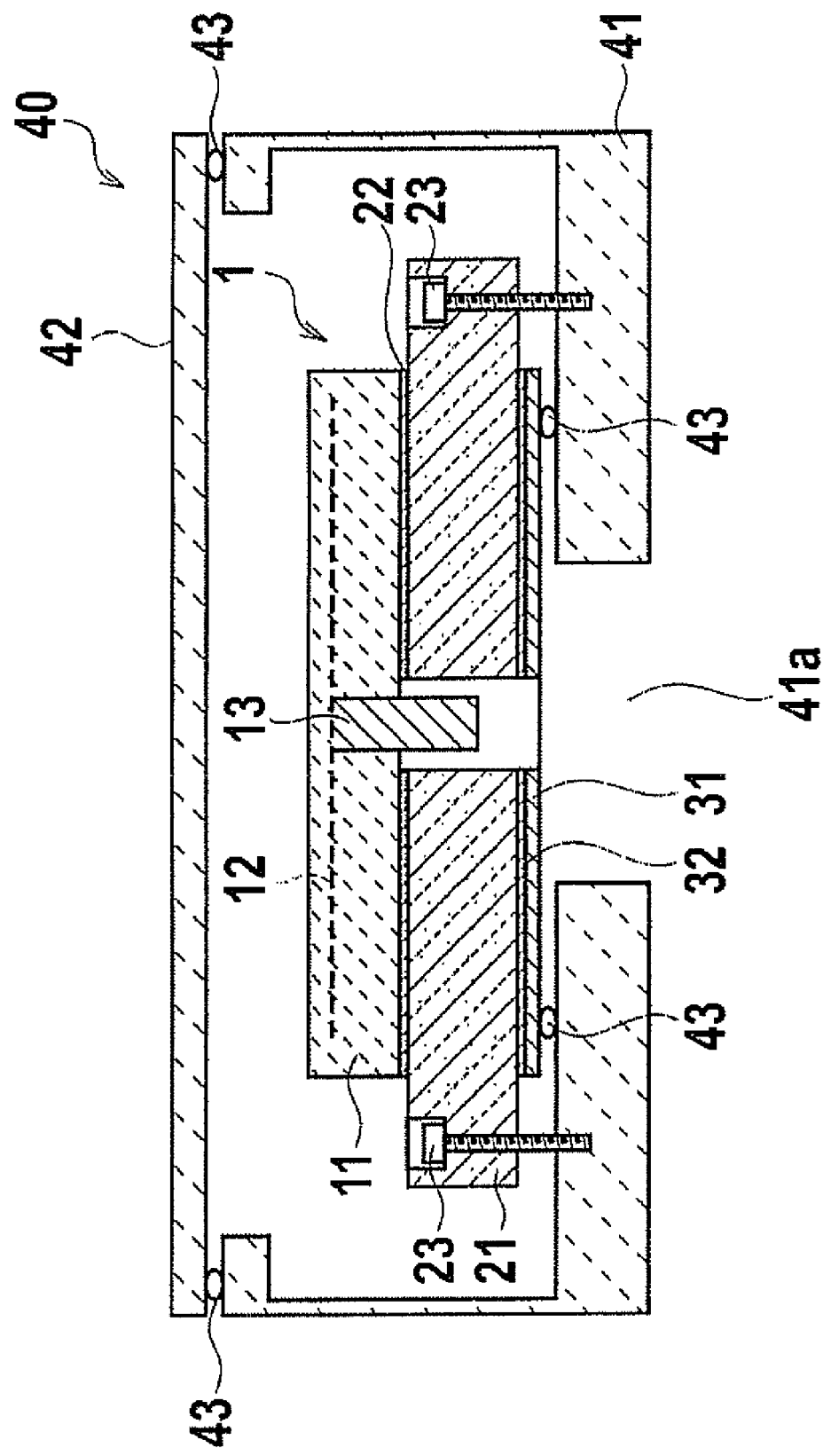
FIG. 2 is a cross sectional view showing the substrate supporting member attached to a processing chamber.

FIG. 2 is a cross-sectional view showing the substrate supporting member 1 of the embodiment attached to the inside of the processing chamber. In FIG. 2, same members as those of FIG. 1 are given same reference numerals, and redundant description thereof is omitted in the following description.

A processing chamber 40 shown in FIG. 2 includes a lower section 41 accommodating the substrate supporting member 1 and an upper section 42 covering the substrate supporting member 1. In the joint part of the lower and upper sections 41 and 42, a sealing member 43 is provided, by which the joint part is made airtight. Around the center of a bottom surface of the lower section 41, an opening 41a used to electrically connect the terminal 13 of the substrate supporting member 1 to an external power supply is formed. The substrate supporting member 1 is arranged on the bottom surface of the lower section 41 so that the opening 41a faces the terminal 13 of the substrate supporting member 1 and is fastened to the lower section 41 by means of bolts 23 inserted into the bolt holes 21b of the composite material member 21. In order to prevent external gas (air) from flowing into the processing chamber 40 through the opening 41a, the sealing member 43 is arranged between the bottom surface of the lower section 41 and the rear surface of the metal plate 31 around the opening 41a. The processing chamber 40 is made airtight in the vicinity of the opening 41a by this sealing member 43. The sealing member 43 is, for example, an O-ring. To the processing chamber 40, a not-shown gas supply source and a suction pump are attached to control the atmosphere (gas concentration, vacuum, and the like) within the processing chamber 40 to predetermined values.

In terms of making the processing chamber 40 airtight in the vicinity of the opening 41a, a conventionally-known substrate supporting member does not include the metallic plate 31 of the substrate supporting member 1 according to the present. invention. Accordingly, in the conventionally-known substrate supporting member, the part corresponding to the composite material body 21 and the bottom surface of the lower section 41 of the processing chamber 40 are sealed by the sealing member 43. However, in the part corresponding to the composite material body 21, some pores inevitably remain. Even if the processing chamber 40 is sealed by the sealing member 43, external air flows into the processing chamber 40 through the remaining pores in some cases.

Moreover, the thermal expansion coefficients of the composite material body 21 and ceramic body 11 are configured to be close to each other but practically not the same. Accordingly, in the conventionally-known substrate supporting member, the composite material body 21 sometimes warped because of the difference in thermal expansion coefficient. Such warp of the composite material body 21 might inversely affect sealing of the processing chamber 40 in the vicinity of the opening 41a.

On the other hand, in the substrate supporting member 1 according to the present invention, the metallic plate 31, which is a bulk without pores, is joined to the composite material body 21 with the joint material 32 interposed therebetween. The pores in the vicinity of the sealing member 43 are completely sealed. Accordingly, it is possible to prevent air from flowing into the processing chamber 40 through the pores, thus ensuring enough sealing performance of the processing chamber 40.

Furthermore, by applying a material having a thermal expansion coefficient equal or close to that of the ceramic body 11 to the metallic plate 31, the warp of the composite material body 21 can be reduced. In this regard, the sealing performance of the processing chamber 40 in the periphery of the opening 41a can be further increased.

From the above description, using the substrate supporting member 1 for manufacturing semiconductor devices, the processes performed for a substrate placed on the substrate supporting member 1, such as film formation or etching, can be performed in a stable good atmosphere.

In terms of blocking the pores of the composite material body 21, the metallic plate 31 should be a bulk plate but may be made of any material. However, in terms of reducing warp of the composite material body 21, more preferably, the metallic plate 31 is made of a metallic material having a thermal expansion coefficient equal or close to that of the ceramic body 11.

When the ceramic body 11 is made of ceramic mainly composed of aluminum nitride, which is suitable for materials of electrostatic chucks, ceramic heaters, and susceptors, the metallic plate 31 is suitably made of molybdenum or KOVAR (KOVAR is a trademark of the Carpenter Technology Corporation, and KOVAR is Known to describe an iron-nickel-cobalt alloy that has a coefficient of thermal Expansion similar to (borosilicate)glass), which has a thermal expansion coefficient close to that of aluminum nitride. In addition to molybdenum and KOVAR, the metallic plate 31 can be made of zirconium or tungsten, which has a thermal expansion coefficient close to that of aluminum nitride.

When the ceramic body 11 is made of ceramic mainly composed of alumina, which is suitable for materials of electrostatic chucks, ceramic heaters, and susceptors, the metallic plate 31 is suitably made of titanium, niobium, or an alloy thereof, which has a thermal expansion coefficient close to that of alumina. In addition to titanium and niobium, the metallic plate 31 can be made of platinum or vanadium, which has a thermal expansion coefficient close to that of alumina.

When the ceramic body 11 is made of ceramic mainly composed of a material other than aluminum nitride and alumina, the metallic plate 31 is preferably made of a metallic material having a thermal expansion coefficient close to that of the ceramic.

Specifically, the difference in thermal expansion coefficient between the metallic plate 31 and ceramic body 11 is preferably not more than $1.0 \times 10^{-6}$/K. When the difference in thermal expansion coefficient is not more than $1.0 \times 10^{-6}$/K, warp can be reduced sufficiently. Especially when the difference in thermal expansion coefficient is not more than $0.5 \times 10^{-6}$/K, depending on the size and material of the composite material body 21, warp can be further reduced to 100 μm or less. When the ceramic body 11 is made of a ceramic mainly composed of aluminum nitride as described above, such a difference in thermal expansion coefficient of not more than $1.0 \times 10^{-6}$/K can be implemented by forming the metallic plate 31 of molybdenum or kovar as a main component and adjusting the content thereof relative to the other components.

The thickness of the metallic plate 31 is preferably not less than 0.2 mm in order to obtain effects on blocking the pores of the composite material body 21 and reducing warp. The maximum thickness of the metallic plate 31 is not particularly limited in terms of the above effects. However, there is no change in the effects when the thickness of the metallic plate 31 is increased to 3 mm or more. Considering the workability and manufacturing cost of a metallic plate and the like, the thickness of the metallic plate 31 is preferably not more than 10 mm and more preferably not more than 3 mm.

As for the size and planer shape of the metallic plate 31, the metallic plate 31 only should be arranged at least in an area near the sealing member 43 in order to obtain the effect on blocking the pores of the composite material body 21. In this regard, the metallic plate 31 may have a ring shape brought into contact, with the O-ring as the sealing member 43. In terms of reducing warp of the composite material body 21, it is preferable that, the metallic plate 31 is joined to the entire rear surface of the composite material body 21, and accordingly, it is preferable that the metallic plate 31 has size and shape substantially equal to those of the composite material body 21.

It is preferable that the surface of the metallic plate 31 which is joined to the composite material body 21 has a center-line average roughness Ra of not more than 0.8 μm, which can further improve the sealing performance.

The joint material 32 which joins the metallic plate 31 and composite material body 21 can be made of a same material as that of the joint material 22 which joins the ceramic body 11 and composite material body 21. Specifically, the joint material 32 may be made of a brazing material mainly composed of aluminum. However, it is preferable that the joint material 32 contains an aluminum alloy and has a thickness of about 50 to 200 μm. Furthermore, preferably, the joint material 32 is a material used for pressure welding of the composite material body 21 and metallic plate 31. The pressure welding prevents generation of pores which may be caused in the case of joining by melt solidification, thus providing good adhesive strength. Moreover, such pressure welding allows the aluminum alloy layer to ensure a thickness which cannot be obtained by brazing.

The substrate supporting member 1 of the embodiment shown in FIG. 1 is an example of an electrostatic chuck. The electrode 12 embedded in the ceramic body 11 is an electrode to produce electrostatic attraction force. The electrode 12 can be made of high melting point metal, for example, such as Mo or W. The form thereof is not particularly limited, and it is possible to use an electrode made of bulk metal such as woven wire (mesh) and a film electrode formed by performing printing, drying, and baking for metal paste. In the case of using the metal bulk electrode as the embedded electrode, the electrode 12 can be also used as an electrode for generating high-frequency plasma. It is therefore particularly preferable to use the substrate supporting member 1 in plasma etching, high-frequency etching, plasma CVD, and the like. As for the planar shape of the electrode, the electrode is not limited to a monopolar electrode and may be an electrode composed of a plurality of divisions such as a bipolar electrode.

The substrate supporting member of the present invention is not limited to the example of the electrostatic chuck shown in FIG. 1. For example, the substrate supporting member may be an example of a hot electrostatic chuck, a ceramic heater, or a susceptor. In the cases of these examples, the electrode 12 is an electrode suitable for each application thereof.

Next, a description is given of an example of a method of manufacturing the substrate supporting member 1 according to the embodiment. First, the ceramic body 11, composite material body 21, and metallic plate 31 are individually produced and prepared.

To produce the ceramic body 11, ceramic raw powder such as aluminum nitride and raw powder of a sintering agent such as yttria ($Y_2O_3$), silica ($SiO_2$), or alumina ($Al_2O_3$) are prepared at a predetermined blending ratio and mixed using a pot mill, a ball mill, or the like. The mixing may be either wet or dry mixing. In the case of wet mixing, the mixture is dried to obtain the raw powder mixture. Thereafter, the raw powder mixture or a substance obtained by granulating the raw powder mixture together with a binder is molded, thus obtaining a disk-shaped compact, for example. The molding method is not limited, and various methods can be used for molding. For example, it is possible to use metallic molding, cold isostatic pressing (CIP), slip casting, and the like. The thus obtained compact is baked using hot pressing, pressureless sintering, or the like at about 1700 to 1900° C. for aluminum nitride, about 1600° C. for alumina, about 1700 to 1800° C. for sialon, and about. 2000 to 2200° C. for silicon carbide to produce a sintered compact.

When the electrostatic chuck or ceramic heater is produced as the substrate supporting member 1, a predetermined electrode is embedded in the molding process. For example, in the case of the electrostatic chuck, a sheet-shaped perforated electrode made of bulk metal, or more preferably, a mesh shaped (wire netting) electrode should be embedded in the raw material powder. In the case of producing the heater, in a similar way to the electrostatic chuck, bulk metal processed into a predetermined shape such as a coil shape or a spiral shape is embedded. Preferably, either electrode is made of high melting point metal, for example such as molybdenum or tungsten.

Moreover, a film-shaped electrode formed by performing printing, drying, and baking for metal paste can be used as the electrode of the electrostatic chuck. In this case, the electrode may be formed in the following manner in the molding process of a ceramic compact. First, two green sheets of, for example, a disk shape which serves as a part of the compact are produced. A metal paste electrode is printed on the surface of one of the green sheets, on which the other green sheet is laid with the printed electrode interposed therebetween, thus producing a green sheet laminate (that is, a compact). The green sheet laminate is then baked. When the ceramic body 11 includes an embedded electrode inside like the electrostatic chuck or heater, after baking, the sintered compact is drilled to the embedded electrode for the terminal 13, which is an electrode lead terminal.

The composite material body 21 may be a composite body of metal and ceramics, which has thermal expansion coefficient close to that of the ceramic body. Preferably, the composite body is composed of Al—Si sintered alloy, Al—SiC composite body, Al—Si—SiC composite material or the like. The composite body can be a commercially available one. To produce the composite material body 21, first a porous ceramic body is produced. Ceramic powder is molded and then baked at a sintering temperature slightly lower than usual, thus producing porous ceramic with a porosity of 10 to 70%, for example. Subsequently, molten aluminum is flown onto the obtained porous ceramic to impregnate the porous ceramic with molten aluminum. The porosity therefore becomes less than 5%. The molten aluminum may contain Si, Mg or the like for improvement of wet-ability of the molten aluminum. The thus-obtained composite material is mechanically processed into a predetermined shape for use as the composite material body 21.

The metallic plate 31 can be a commercially available plate having a predetermined component composition and a predetermined thickness.

Subsequently, the ceramic body 11 and composite material body 21 are joined to each other, and at the same time the composite material body 21 and metallic plate 31 are joined to each other. In this joining process, Al alloy sheets about, 50 to 200 μm thick are individually interposed between the ceramic body 11 and composite material body 21 and between the composite material body 21 and the metallic plate 31. The Al alloy sheets are heated in vacuum of not more than 13.3 Pa (0.1 Torr) at a temperature not more than solidus temperature Ts° C. of the aluminum alloy and not less than a temperature 30° C. below Ts° C. (Ts-30). By setting the temperature condition for joining to the aforementioned ranges, the joining mainly by mechanical pressure welding can be performed with the initial thickness substantially being maintained without the Al alloy sheets being molten. For example, when the joint materials 22 and 32 are Al alloy containing 10 wt % Si and 1.5 wt % Mg, the solidus temperature Ts of the Al alloy is 560° C., and the heating condition for joining are set to 500 to 560° C. and more preferably 530 to 550° C.

After the heating temperature is substantially stabilized, pressurization is performed in the direction of an axis substantially perpendicular to the joint surface. The pressurization burden is 4.9 to 19.6 MPa (50 to 200 kgf/cm$^2$). By applying the above pressurization burden, the solid-liquid Al alloy firmly joins the ceramic body 11 and composition material body 21 and the composite material body 21 and metallic plate 31.

In this joining process, the Al alloy sheets do not melt. Accordingly, there is no shrinkage (pores) which can be caused by solidification after melting, and the substantial joint area can be larger than that in the case of brazing. The adhesive strength of the joint layer can be therefore increased. Moreover, in the aforementioned joining method, the thickness of the Al alloy sheets cannot substantially change after joining, thus making a thick joint layer with a thickness of not less than 50 μm. On the joint surface of the ceramic body, a metallic thin film or the like may be previously formed before joining.

EXAMPLES

Hereinafter, a description is given of examples and comparative examples of the present invention.

First, as for the ceramic body 11, ceramic bodies which were made of aluminum nitride and also functioned as electrostatic chucks were produced. Specifically, aluminum nitride powder obtained by reduction nitridation was added with an acrylic resin binder, followed by spray granulation to produce granulated powder. The granulated powder was subjected to uniaxial pressing using a mold to obtain compacts. In this pressing, a Mo bulk electrode which was a mesh plate electrode was embedded in each compact. The compacts were sintered by hot pressing to produce integrated sintered products. Pressure at hot pressing was 200 kgf/cm$^2$, and at baking, the temperature was increased to 1900° C. as a maximum temperature at a temperature increasing rate of 10° C./h and kept for one hour. Disk-shaped aluminum nitride ceramic bodies (φ300 mm in diameter and 10 mm thick) were thus produced. In each sintered ceramic body, through holes having an outer diameter of φ5 mm were formed at three positions on an arc with a radius of 90 mm around the central axis.

As for the composite material body 21, silicon carbide (SiC) particles with a particle size of 50 to 100 μm were molded using uniaxial pressing, and then the thus-obtained compacts were baked under the temperature conditions of 1900 to 2200° C. in a nitrogen atmosphere. Porous SiC sintered compacts with porosities of about 30% were thus obtained. These SiC sintered compacts were impregnated with molten aluminum or aluminum-silicon alloy with the impregnating conditions varied, thus obtaining a plurality of composite material bodies with different entire porosities. Each composite material body was subjected to processing into a disk with an outer diameter of φ300 mm and a thickness of 150 mm. Furthermore, drilling was performed for each composite material body to provide φ5 mm through holes at the same positions as those of the ceramic body.

As for the metallic plate 31, a plurality of metallic plates which were made of molybdenum or KOVAR and had an outer diameter Φ of 300 mm and various thicknesses were prepared. In terms of the surface roughness of the surface of each metallic plate in contact with a sealing member, the center line average roughness Ra was 0.8 μm or less.

As for the joint materials 22 and 32, two 120 μm thick Al alloy sheets made of Al alloy containing 10 wt % Si and 1.5 wt % Mg were prepared. One of the sheets was cut in accordance with the joint surface and shape of the ceramic bodies so as to have an outer diameter of 300 mm and had portions corresponding to through holes cut out in a similar manner. The other sheet was cut in accordance with the joint surface and shape of the metallic plates so as to have an outer diameter of 300 mm and had portions corresponding to the through holes cut out in a similar manner. After the cutting process, each ceramic body, composite material body, and metallic plate were stacked on one another with the Al alloy sheets individually interposed between the ceramic body and composite material body and between the composite material body and metallic plate and were subjected to pressure welding under the conditions of an atmosphere pressure of $1 \times 10^{-4}$ Torr ($1.33 \times 10^{-2}$ Pa) and a uniaxial pressing pressure of 100 kgf/cm$^2$ ($9.8 \times 10^6$ Pa). The temperature was not more than the solidus temperature (Ts) of the Al alloy (560° C.) and not less than the solidus temperature (Ts) −30° C.

Each of the thus obtained substrate supporting members was examined in terms of the relationship between the porosity of the composite material body, the type and thickness of the metallic plate, and the sealing performance of the substrate supporting member attached to the processing chamber. The way of examining the sealing performance is described using FIG. 3. FIG. 3 is an explanatory view of the way of examining the sealing performance, and in the drawing, the same members as those of FIGS. 1 and 2 are given same reference numerals.

As shown in FIG. 3, the substrate supporting member 1 is attached to the inside of the processing chamber 40. In the vicinity of the opening 41a of the lower section 41 of the processing chamber 40, a helium gas container 52 accommodating helium gas and a spray gun 52 connected to the helium gas container 52 are provided. The spray gun 52 releases helium gas toward the opening 41a. To the side wall of the lower section 41 of the processing chamber 40, a helium leak detector 53 is attached so as to measure an amount of helium within the processing chamber 40.

With the processing chamber 40 exhausted by a not-shown pump to high vacuum, helium gas is sprayed onto the vicinity of the opening 41a by the spray gun 52 connected to the helium gas container 51, and the amount of helium gas within the processing chamber 40 is detected by the helium leak detector 53 for examination on whether gas flows into the processing chamber 40 through the opening 41a (gas leaks).

Table 1 shows examination results.

TABLE 1

|  | COMPOSITE MATERIAL BODY φ350 × 15 mm POROSITY (%) | METALLIC PLATE (φ300 mm) TYPE-THICKNESS (mm) | CHARACTERISTIC SEALING PERFORMANCE (Pa · m$^3$/sec) |
|---|---|---|---|
| EXAMPLE 1 | 4.8 | Mo-0.5 mm | LESS THAN $1 \times 10^{-9}$ |
| EXAMPLE 2 | 4.8 | KOVAR-0.5 mm | LESS THAN $1 \times 10^{-9}$ |

TABLE 1-continued

|  | COMPOSITE MATERIAL BODY φ350 × 15 mm POROSITY (%) | METALLIC PLATE (φ300 mm) TYPE-THICKNESS (mm) | CHARACTERISTIC SEALING PERFORMANCE (Pa · m³/sec) |
|---|---|---|---|
| EXAMPLE 3 | 3 | Mo-0.5 mm | LESS THAN $1 \times 10^{-9}$ |
| EXAMPLE 4 | 1 | Mo-0.5 mm | LESS THAN $1 \times 10^{-9}$ |
| EXAMPLE 5 | 0.01 | Mo-0.5 mm | LESS THAN $1 \times 10^{-9}$ |
| COMPARATIVE EXAMPLE 1 | 10 | NOT PROVIDED | UNMEASURABLE |
| COMPARATIVE EXAMPLE 2 | 5 | NOT PROVIDED | UNMEASURABLE |
| COMPARATIVE EXAMPLE 3 | 4.8 | NOT PROVIDED | UNMEASURABLE |
| COMPARATIVE EXAMPLE 4 | 3 | NOT PROVIDED | UNMEASURABLE |
| COMPARATIVE EXAMPLE 5 | 1 | NOT PROVIDED | UNMEASURABLE |
| COMPARATIVE EXAMPLE 6 | 0.01 | NOT PROVIDED | UNMEASURABLE |
| COMPARATIVE EXAMPLE 7 | 10 | Mo-0.5 mm | UNMEASURABLE |
| COMPARATIVE EXAMPLE 8 | 5 | Mo-0.5 mm | UNMEASURABLE |
| COMPARATIVE EXAMPLE 9 | 5 | KOVAR-0.5 mm | UNMEASURABLE |

As is apparent from Table 1, in Examples 1 to 5, in each of which the porosity of the composite material body was less than 5% and the substrate supporting member included one of the metallic plates, the amount of helium gas leaked to the processing chamber was less than $1 \times 10^{-9}$ Pa·m³/sec, and good sealing performance could be obtained. On the other hand, in each of Comparative Examples 1 to 6, in which the substrate supporting members included no metallic plates, regardless of the porosities of the composite material. bodies, there was a gap in the seal portion, and a large amount of helium gas leaked which could not be quantitatively measured by a high-accuracy helium leak detector. Moreover, in each of Comparative Examples 7 to 9, in which the porosities of the composite material bodies were not less than 5%, some pores communicated with each other while the substrate supporting member was provided with the metallic plate, and a large amount of helium gas leaked through such pores.

Next, each of the substrate supporting members which included the composite material bodies having porosities of 1% and various thermal expansion coefficients at 40 to 550° C. was examined in terms of the relationship between the difference in thermal expansion coefficient between the composite material body and the ceramic body (thermal expansion coefficient: $5.0 \times 10^{-6}$/K) made of aluminum nitride, the type and thickness of the metallic plate, the sealing performance of the substrate supporting member attached to the processing chamber, and the warp amount of the composite material body. The thermal expansion coefficients of the composite material bodies were adjusted by variously changing the amount ratio of Al to SiC in the Al—Si—SiC complex as the composite material Table 2 shows examination results.

TABLE 2

| | COMPOSITE MATERIAL BODY φ350 × 15 m: POROSITY 1% | | | | |
|---|---|---|---|---|---|
| | THERMAL EXPANSION COEFFICIENT AT 40 TO 550° C. (1/K) | DIFFERENCE IN THERMAL EXPANSION COEFFICIENT FROM CERAMIC BODY ($\times 10^{-6}$/K) | METALLIC PLATE (φ300 mm) TYPE-THICKNESS (mm) | CHARACTERISTIC | |
| | | | | SEALING PERFORMANCE (Pa · m³/sec) | WARP AMOUNT (μm) |
| COMPARATIVE EXAMPLE 10 | $3.5 \times 10^{-6}$ | 1.5 | NOT PROVIDED | UNMEASURABLE | 570 |
| EXAMPLE 6 | $6.5 \times 10^{-6}$ | 1.5 | Mo-0.5 mm | $9 \times 10^{-9}$ | 340 |
| EXAMPLE 7 | $4.5 \times 10^{-6}$ | 0.5 | Mo-0.1 mm | $6 \times 10^{-9}$ | 300 |
| EXAMPLE 8 | $6.0 \times 10^{-6}$ | 1.0 | Mo-0.5 mm | LESS THAN $1 \times 10^{-9}$ | 220 |
| EXAMPLE 9 | $4.0 \times 10^{-6}$ | 1.0 | Mo-0.5 mm | LESS THAN $1 \times 10^{-9}$ | 200 |
| EXAMPLE 10 | $4.5 \times 10^{-6}$ | 0.5 | Mo-0.2 mm | LESS THAN $1 \times 10^{-9}$ | 100 |
| EXAMPLE 11 | $5.5 \times 10^{-6}$ | 0.5 | Mo-0.5 mm | LESS THAN $1 \times 10^{-9}$ | 60 |
| EXAMPLE 12 | $4.5 \times 10^{-6}$ | 0.5 | Mo-0.5 mm | LESS THAN $1 \times 10^{-9}$ | 50 |
| EXAMPLE 13 | $4.5 \times 10^{-6}$ | 0.5 | Mo-3.0 mm | LESS THAN $1 \times 10^{-9}$ | 30 |
| EXAMPLE 14 | $5.0 \times 10^{-6}$ | 0 | Mo-0.5 mm | LESS THAN $1 \times 10^{-9}$ | 10 |

As is apparent from Table 2, in Comparative Example 10, in which the substrate supporting member included no the metallic plate and the difference in thermal expansion coefficient was more than $1.0 \times 10^{-6}$/K, the composite material body greatly warped to produce microscopic gap or adhesion failure in the seal portion, and a large amount of helium gas leaked which could not be measured by the high-accuracy helium leak detector. As is apparent from Example 6, especially with the metallic plate having a thickness of not less than 0.5 mm, good sealing performance could be maintained even if the difference in thermal expansion coefficient was $1.5 \times 10^{-6}$/K.

In Examples 8 and 9, in which the differences in thermal expansion coefficient were $1.0 \times 10^{-6}$/K and the metallic plates were 0.5 mm thick, the composite material bodies warped less than those of Examples 6 and 7, resulting in better sealing performance. In other words, when the metallic plate according to the present invention was provided, the warp was reduced, and good sealing performance was obtained even if the difference in thermal expansion coefficient was as large as $1.0 \times 10^{-6}$/K. Furthermore, with the metallic plate having a thickness of 0.2 mm or more, better sealing performance could be obtained.

In Examples 10 to 14, in which the differences in thermal expansion coefficient were $0.5 \times 10^{-6}$/K to 0/K and the metallic plates were 0.5 mm thick, the composite material bodies warped less than those of Examples 8 and 9 did, and better sealing performance could be obtained. In Example 14, which had a difference in thermal expansion coefficient of 0/K, in particular, the composite material plate warped less than those of Examples 10 to 13 did, and the dimensional accuracy was particularly good.

Next, the material of the ceramic body 11 having an electrostatic chuck function was changed. Ceramic bodies made of alumina were produced and examined in a similar manner to the aforementioned examples of the substrate supporting member including the ceramic body made of aluminum nitride.

Composite material bodies of these examples were the same as those of the aforementioned examples.

As for the metallic plate 31, a plurality of metallic plates which were made of titanium or niobium and had an outer diameter Φ of 300 mm and various thicknesses were prepared. In terms of the surface roughness of the surface of each metallic plate in contact with the sealing member, the center line average roughness Ra was not more than 0.8 μm.

Joint materials of these examples were the same Al alloy sheets as those of the aforementioned examples.

Each of the thus-obtained substrate supporting members was examined in terms of the relationship between the porosity of the composite material body, the type and thickness of the metallic plate, and the sealing performance of the substrate supporting member which was attached to the processing chamber in the similar way to the aforementioned examples. Table 3 shows examination results.

TABLE 3

|  | COMPOSITE MATERIAL BODY φ350 × 15 mm POROSITY (%) | METALLIC PLATE (φ300 mm) TYPE-THICKNESS (mm) | CHARACTERISTIC SEALING PERFORMANCE (Pa · m³/sec) |
| --- | --- | --- | --- |
| EXAMPLE 15 | 4.8 | Ti-0.5 mm | LESS THAN $1 \times 10^{-9}$ |
| EXAMPLE 16 | 4.8 | Nb-0.5 mm | LESS THAN $1 \times 10^{-9}$ |
| EXAMPLE 17 | 3 | Ti-0.5 mm | LESS THAN $1 \times 10^{-9}$ |
| EXAMPLE 18 | 1 | Ti-0.5 mm | LESS THAN $1 \times 10^{-9}$ |
| EXAMPLE 19 | 0.01 | Ti-0.5 mm | LESS THAN $1 \times 10^{-9}$ |
| COMPARATIVE EXAMPLE 11 | 10 | NOT PROVIDED | UNMEASURABLE |
| COMPARATIVE EXAMPLE 12 | 5 | NOT PROVIDED | UNMEASURABLE |
| COMPARATIVE EXAMPLE 13 | 4.8 | NOT PROVIDED | UNMEASURABLE |
| COMPARATIVE EXAMPLE 14 | 3 | NOT PROVIDED | UNMEASURABLE |
| COMPARATIVE EXAMPLE 15 | 1 | NOT PROVIDED | UNMEASURABLE |
| COMPARATIVE EXAMPLE 16 | 0.01 | NOT PROVIDED | UNMEASURABLE |
| COMPARATIVE EXAMPLE 17 | 10 | Ti-0.5 mm | UNMEASURABLE |
| COMPARATIVE EXAMPLE 18 | 5 | Ti-0.5 mm | UNMEASURABLE |
| COMPARATIVE EXAMPLE 19 | 5 | Nb-0.5 mm | UNMEASURABLE |

The ceramic bodies made of alumina were produced in a similar way to the method of producing the ceramic bodies made of aluminum nitride except that the material of the ceramic bodies was changed to alumina. Specifically, alumina powder was added with an acrylic resin binder, followed by spray granulation to produce granulated powder. The granulated powder was subjected to uniaxial pressing using a mold to obtain compacts. The compacts were then sintered by hot pressing to produce integrated sintered products. Pressure at hot pressing was 200 kgf/cm², and at sintering, the temperature was increased to 1900° C. as a maximum temperature at a temperature increasing rate of 10° C./h and kept for one hour. Disk-shaped alumina sintered bodies (φ300 mm in diameter and 10 mm thick) were thus produced. On the principal plane of each alumina sintered body, the electrode was formed by the screen printing method. The electrode was formed from WC powder containing 20% alumina powder. Next, each of the disk-shaped alumina sintered body was set in the metal mold. Granules of alumina were filled onto the electrode formed surface of the alumina sintered body and were subjected to the press molding, thus, an alumina compacted body was formed on the alumina sintered body. The combination structure of the alumina compacted body and the alumina sintered bodies were fired by the hot press method. In such a way, ceramic bodies made of alumina ware formed. In each of the sintered ceramic bodies, through holes with an outer diameter φ5 mm were formed at three positions on an arc with a radius of 90 mm around the central axis.

As is apparent from Table 3, in Examples 15 to 19, in each of which the porosity of the composite material body was less than 5% and the substrate supporting member included one of the metallic plates, the amount of helium gas leaked into the processing chamber was less than $1 \times 10^{-9}$ Pa·m³/sec, and good sealing performance could be obtained. On the other hand, in each of Comparative Examples 11 to 16, in which the substrate supporting members included no metallic plates, regardless of the porosities of the composite material bodies, there was a gap in the seal portion, and a large amount of helium gas leaked which could not be measured by the high accuracy helium leak detector. Moreover, in each of Comparative Examples 17 to 29, in which the porosities of the composite material bodies were not less than 5%, some pores communicated with each other while the substrate supporting member was provided with the metallic plate, and a large amount of helium gas leaked through such pores.

Next, each of the substrate supporting members which included the composite material bodies having a porosity of 1% and various thermal expansion coefficients at 40 to 550° C. was examined in terms of the relationship between the difference in thermal expansion coefficient between the composite material body and the ceramic body (thermal expansion coefficient: $7.2 \times 10^{-6}$/K) made of alumina, the type and thickness of the metallic plate, the sealing performance of the substrate supporting member attached to the inside of the processing chamber, and the warp amount of the composite material body. The thermal expansion coefficients of the composite material bodies were adjusted by variously changing the amount ratio of Al and SiC in the Al—Si—SiC complex as a composite material. The examination results are shown in Table 4.

TABLE 4

| | COMPOSITE MATERIAL BODY φ350 × 15 m: POROSITY 1% | | | | |
|---|---|---|---|---|---|
| | THERMAL EXPANSION | DIFFERENCE IN THERMAL EXPANSION | METALLIC PLATE | CHARACTERISTIC | |
| | COEFFICIENT AT 40 TO 550° C. (1/K) | COEFFICIENT FROM CERAMIC BODY (×10⁻⁶/K) | (φ300 mm) TYPE-THICKNESS (mm) | SEALING PERFORMANCE (Pa · m³/sec) | WARP AMOUNT (μm) |
| COMPARATIVE EXAMPLE 20 | $5.7 \times 10^{-6}$ | 1.5 | NOT PROVIDED | UNMEASURABLE | 570 |
| EXAMPLE 20 | $8.7 \times 10^{-6}$ | 1.5 | Ti-0.5 mm | $9 \times 10^{-9}$ | 340 |
| EXAMPLE 21 | $6.7 \times 10^{-6}$ | 0.5 | Ti-0.1 mm | $6 \times 10^{-9}$ | 300 |
| EXAMPLE 22 | $8.2 \times 10^{-6}$ | 1.0 | Ti-0.5 mm | LESS THAN $1 \times 10^{-9}$ | 240 |
| EXAMPLE 23 | $6.2 \times 10^{-6}$ | 1.0 | Ti-0.5 mm | LESS THAN $1 \times 10^{-9}$ | 190 |
| EXAMPLE 24 | $6.7 \times 10^{-6}$ | 0.5 | Ti-0.2 mm | LESS THAN $1 \times 10^{-9}$ | 120 |
| EXAMPLE 25 | $7.7 \times 10^{-6}$ | 0.5 | Ti-0.5 mm | LESS THAN $1 \times 10^{-9}$ | 70 |
| EXAMPLE 26 | $6.7 \times 10^{-6}$ | 0.5 | Ti-0.5 mm | LESS THAN $1 \times 10^{-9}$ | 55 |
| EXAMPLE 27 | $6.7 \times 10^{-6}$ | 0.5 | Ti-3.0 mm | LESS THAN $1 \times 10^{-9}$ | 32 |
| EXAMPLE 28 | $7.2 \times 10^{-6}$ | 0 | Ti-0.5 mm | LESS THAN $1 \times 10^{-9}$ | 15 |

As is apparent shown in Table 4, in Comparative Example 20, in which the substrate supporting member included no metallic plate and the difference in thermal expansion coefficient was more than $1.0 \times 10^{-6}$/K, the composite material body greatly warped to produce microscopic gap or adhesion failure in the seal portion, and a large amount of helium gas leaked which could not be measured by the high-accuracy helium leak detector. As is apparent from Example 20, especially with the metallic plate having a thickness of not less than 0.5 mm, good sealing performance could be maintained even if the difference in thermal expansion coefficient was $1.5 \times 10^{-6}$/K.

In Examples 20 to 23, in which the differences in thermal coefficient expansion were $1.0 \times 10^{-6}$/K and the metallic plates were 0.5 mm thick, the composite material bodies warped less than those of Examples 20 and 21 did, resulting in better sealing performance. In other words, when the metallic plate according to the present invention was provided, even if the difference in thermal expansion coefficient was as large as $1.0 \times 10^{-6}$/K, the warp was reduced, and good sealing performance was obtained. Furthermore, with the metallic plate having a thickness of 0.2 mm or more, better sealing performance could be obtained.

In Examples 24 to 28, in which the differences in thermal expansion coefficient were $0.5 \times 10^{-6}$/K to 0/K and the metallic plates were 0.5 mm thick, the composite material bodies warped less than those of Examples 22 and 23 did, and better sealing performance could be obtained. In Example 28, which had a difference in thermal expansion coefficient of 0/K, in particular, the composite material body warped less than those of Examples 24 to 27 did, and the dimensional accuracy thereof was particularly good.

Generally, it is difficult to manufacture a composite material of porous ceramic with pores filled with metal which has a thermal expansion coefficient completely stabilized. Moreover, it is more difficult to make the porosity 0%, and the manufacturing yield of such a composite material is low. According to the present invention, even in such a case, the substrate supporting member can provide stable sealing performance, which greatly contributes to the industry.

Hereinabove, the substrate supporting member of the present invention and the manufacturing method thereof are described along the embodiment and examples. However, the present invention is not limited by these descriptions about embodiment and examples. It is obvious to those skilled in the art that various improvements and modifications can be made. The above embodiment and examples are just examples, and any one including substantially the same configuration as the technical idea described in claims of the present invention and has a similar operational effect thereto is included within the technical scope of the present invention.

What is claimed is:

1. A substrate supporting member comprising:
   a plate-shaped ceramic body having a surface serving as a substrate supporting surface;
   a plate-shaped composite material body joined to a surface of the ceramic body opposite to the substrate supporting surface with a joint material made of aluminum alloy and having a thickness of 50 to 200 μm interposed therebetween, the plate-shaped composite material body being made of porous ceramic with pores filled with metal, and the composite material body having a porosity of more than 0% and not more than 5%; and
   a metallic plate joined to a surface of the composite material body opposite to the surface joined to the ceramic body with a joint material made of aluminum alloy and having a thickness of 50 to 200 μm interposed therebetween,
   wherein either
   (i) the ceramic body is made of ceramic mainly composed of aluminum nitride, and the metallic plate is made of at least a metallic material selected from molybdenum and KOVAR, or
   (ii) the ceramic body is made of ceramic mainly composed of alumina and the metallic plate is made of at least a metallic material selected from titanium and niobium, or an alloy thereof,
   wherein a difference in thermal expansion coefficient between the metallic plate and the ceramic body is not more than $1.0 \times 10^{-6}$/K,
   wherein the porous ceramic of the composite material body is alumina, sialon or silicon carbide, and
   wherein the metallic plate has a thickness of not less than 0.2 mm and not more than 3 mm.

* * * * *